(12) United States Patent
Matsufuji et al.

(10) Patent No.: US 8,120,974 B2
(45) Date of Patent: Feb. 21, 2012

(54) NONVOLATILE SEMICONDUCTOR MEMORY DEVICE

(75) Inventors: Kensuke Matsufuji, Kanagawa-ken (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 12/690,623

(22) Filed: Jan. 20, 2010

(65) Prior Publication Data
US 2010/0182819 A1    Jul. 22, 2010

(30) Foreign Application Priority Data
Jan. 22, 2009 (JP) ................................. 2009-011595

(51) Int. Cl.
*G11C 7/00* (2006.01)
(52) U.S. Cl. ......... 365/189.15; 365/189.16; 365/189.11; 365/189.19
(58) Field of Classification Search ............. 365/189.15, 365/189.16, 189.11, 189.19, 225.7
See application file for complete search history.

(56) References Cited

U.S. PATENT DOCUMENTS

| | | | |
|---|---|---|---|
| 6,222,779 B1 * | 4/2001 | Saito et al. ............... | 365/189.09 |
| 6,925,009 B2 * | 8/2005 | Noguchi et al. .......... | 365/185.17 |
| 7,345,903 B2 | 3/2008 | Nakano et al. | |
| 7,359,274 B2 * | 4/2008 | Noguchi et al. ......... | 365/230.03 |
| 7,542,367 B2 | 6/2009 | Matsufuji et al. | |
| 7,630,226 B2 | 12/2009 | Matsufuji et al. | |
| 2008/0316852 A1 | 12/2008 | Matsufuji et al. | |

* cited by examiner

*Primary Examiner* — Son Dinh
(74) *Attorney, Agent, or Firm* — Oblon, Spivak, McClelland, Maier & Neustadt, L.L.P.

(57) ABSTRACT

A nonvolatile semiconductor memory device comprising: a memory cell array in which two bit lines are provided to each one bit of input data, and memory cells each including an anti-fuse element are arranged at an intersection point between one of the two bit lines and an even address word line, and an intersection point between the other one of the two bit lines and an odd address word line, respectively; a plurality of booster circuits which are arranged in a plurality of memory banks, respectively, and each of which generates a write voltage and a read voltage to be supplied to a corresponding one of the anti-fuse elements of the respective memory banks, each of the memory banks obtained by dividing the memory cell array; a booster circuit controller to issue an instruction to generate the write voltage and the read voltage to the plurality of booster circuits; a word line selector to activate a different word line at the time of writing from one to be activated at the time of reading, with respect to the same address value of an address signal; a write bit line selector to select bit lines one by one from the memory banks, respectively, at the time of writing, the bit lines performing writing simultaneously; and a read bit line selector to select a bit line at the time of reading, the bit line outputting data.

19 Claims, 13 Drawing Sheets

| RA1 | RA0 | W0 | W1 | W2 | W3 |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

| RA1 | RA0 | W0 | W1 | W2 | W3 |
|---|---|---|---|---|---|
| 0 | 0 | 1 | 1 | 0 | 0 |
| 0 | 1 | 0 | 0 | 1 | 1 |
| 1 | 0 | 1 | 1 | 0 | 0 |
| 1 | 1 | 0 | 0 | 1 | 1 |

FIG. 3B

| WE=1, RE=0 | | | | | | | | | |
|---|---|---|---|---|---|---|---|---|---|
| RA1 | RA0 | b0e | b0o | b1e | b1o | b2e | b2o | b3e | b3o |
| — | 0 | DI0 | — | DI1 | — | DI2 | — | DI3 | — |
| — | 1 | — | DI0 | — | DI1 | — | DI2 | — | DI3 |

FIG. 4

| WE=0, RE=1 | | | | | | | | | |
|---|---|---|---|---|---|---|---|---|---|
| RA1 | RA0 | b0e | b0o | b1e | b1o | b2e | b2o | b3e | b3o |
| 0 | – | DO0 | DO1 | DO2 | DO3 | – | – | – | – |
| 1 | – | – | – | – | – | DO0 | DO1 | DO2 | DO3 |

FIG. 5

| WE | RE | RA1 | S1 | S2 |
|----|----|-----|-----|-----|
| 1  | 0  | —   | ON  | ON  |
| 0  | 1  | 0   | ON  | OFF |
| 0  | 1  | 1   | OFF | ON  |

NONVOLATILE SEMICONDUCTOR MEMORY DEVICE

CROSS-REFERENCE TO RELATED APPLICATION

This application is based upon and claims the benefit of priority from the prior Japanese Patent Application No. 2009-11595 filed in Japan on Jan. 22, 2009, the entire contents of which are incorporated herein by reference.

BACKGROUND OF THE INVENTION

1. Field of the Invention

The present invention relates to a nonvolatile semiconductor memory device.

2. Description of the Related Art

As a nonvolatile semiconductor memory device of an irreversible type, which retains stored information even when power is disconnected, there is a one time programmable (OTP) memory to which data can be written only once.

Examples of a memory element used in an electrically writable OTP memory include an anti-fuse element of a MOS structure or a capacitor structure. Writing of data to the OTP memory is performed by breaking down or not breaking down an insulating film between both terminals of the anti-fuse element.

Specifically, when the insulating film between both terminals of an anti-fuse element is broken down by application of a high voltage between both the terminals of the anti-fuse element, the anti-fuse element changes to a low resistance state. Accordingly, when a voltage is applied between both the terminals, the current flows through the anti-fuse element. Here, this state is referred to as a retention state of "1" data.

On the other hand, when no voltage is applied between both the terminals of the anti-fuse element, the insulating film of the anti-fuse element is not broken down, so that no current flows through the anti-fuse element. In this respect, this state is referred to as a retention state of "0" data.

A read operation of such an OTP memory is performed by applying, between both the terminals of the anti-fuse element, a voltage low enough not to break down the insulating film, and then detecting whether a potential of a bit line connected to the anti-fuse element increases. If the insulating film is broken down, the current flows through the anti-fuse element, so that the potential of the bit line increases. In other words, "1" data is read out.

As described above, the operations to write and read data to an anti-fuse element are performed in the OTP memory by the simple operation, which is only to apply a voltage between both the terminals of the anti-fuse element. For this reason, the field of application of the OTP memory has been spreading to cover applications for redundancy of a large capacity memory, tuning of an analog circuit, storing of a code such as a cryptography key, management of a manufacturing history and the like. Thus, use of the OPT memory in the future as an irreversible nonvolatile semiconductor memory device is most expected to grow.

However, when the operation to write "1" data is performed, breaking down of the insulating film alone as in the case of the aforementioned OTP memory does not change the anti-fuse element to a sufficiently low resistance state, so that it is necessary to flow a large current after the breaking down of the insulating film. Accordingly, the current capacity of a circuit to generate a high voltage for breaking down the insulating film needs to be increased. However, since the current capacity is limited, the number of bits to which data can be written simultaneously is restricted.

In order to perform writing to multiple bits simultaneously under such a restriction, there has been proposed heretofore a method in which a high voltage for writing is repeatedly applied to all bits of the same word line, and the writing is performed several times in a separated manner (refer to Japanese Patent Application Publication No. 2006-338766 (pages 7 to 8, FIG. 1)).

However, in the aforementioned proposed method, the high voltage applied at the time of later writing is also applied to the anti-fuse element whose insulating film has been broken down and has thus become a low resistance state earlier. Accordingly, a large current flows through the anti-fuse element whose insulating film has been broken down, so that a lack of the current capacity occurs in the circuit generating the high voltage for breaking down the insulating films. As a result, there arises a concern that the sufficient amount of the write voltage and the large current flowing through after the break down of the insulating film may not be obtained. In other words, there arises a problem that writing of data cannot be performed stably.

Moreover, in the aforementioned OTP memory, a current flows through an anti-fuse element when a read operation is performed. Thus, the amount of current consumption at the time of the read operation is desirably reduced.

SUMMARY OF THE INVENTION

According to an aspect of the invention, there is provided a nonvolatile semiconductor memory device comprising: a memory cell array in which two bit lines are provided to each one bit of input data, and memory cells each including an anti-fuse element are arranged at an intersection point between one of the two bit lines and an even address word line, and an intersection point between the other one of the two bit lines and an odd address word line, respectively; a plurality of booster circuits which are arranged in a plurality of memory banks, respectively, and each of which generates a write voltage and a read voltage to be supplied to a corresponding one of the anti-fuse elements of the respective memory banks, each of the memory banks obtained by dividing the memory cell array; a booster circuit controller to issue an instruction to generate the write voltage and the read voltage to the plurality of booster circuits; a word line selector to activate a different word line at the time of writing from one to be activated at the time of reading, with respect to the same address value of an address signal; a write bit line selector to select bit lines one by one from the memory banks, respectively, at the time of writing, the bit lines performing writing simultaneously; and a read bit line selector to select a bit line at the time of reading, the bit line outputting data.

According to an aspect of the invention, there is provided a nonvolatile semiconductor memory device comprising: a first memory bank including a plurality of first bit lines, a plurality of word lines intersecting with the plurality of first bit lines, and a plurality of memory cells provided at intersection points between the plurality of first bit lines and the plurality of word lines, each of the plurality of memory cells including an anti-fuse element; a second memory bank including a plurality of second bit lines, the plurality of word lines intersecting with the plurality of second bit lines, and a plurality of memory cells provided at intersection points between the plurality of second bit lines and the plurality of word lines, each of the plurality of memory cells including an anti-fuse element; a first booster circuit to supply a write voltage and a read voltage to the plurality of first bit lines; a second booster circuit to supply a write voltage and a read voltage to the plurality of second bit lines; a booster circuit controller to control operations of the first and second booster circuits; a word line selector to activate one of the plurality of word lines at the time of writing data, and to activate a plurality of lines of the plurality of word lines at the time of reading data; a write bit line selector to select one of the plurality of first bit lines and one of the plurality of second bit lines at the time of writing data; and a read bit line selector to select any one set of bit lines from a set of the plurality of first bit lines and a set of the plurality of second bit lines at the time of reading data, wherein the booster circuit controller performs control, at the time of writing data, so that both of the first and second booster circuits output the write voltage, and the booster circuit controller performs control, at the time of reading data, so that one of the first and second booster circuits outputs the read voltage, the one booster circuit corresponding to the one set of bit lines selected by the read bit line selector.

According to an aspect of the invention, there is provided a nonvolatile semiconductor memory device comprising: a plurality of memory banks each including a plurality of memory cells arranged in a matrix, each of the memory cells including an anti-fuse element; a plurality of booster circuits provided for the plurality of memory banks, respectively, each of the plurality of booster circuits supplying a write voltage and a read voltage to the memory cells included in a corresponding one of the memory banks; a booster circuit controller to drive all of the plurality of booster circuits so that all of the plurality of booster circuits supply the write voltage to all of the memory banks at the time of writing data, and to select and then drive a part of the plurality of booster circuits so that the part of the plurality of booster circuits supply the read voltage to a part of the memory banks corresponding to the selected part of the booster circuits at the time of reading data; a word line selector to selectively activate, at the time of writing data, one of a plurality of word lines shared by the plurality of memory banks, and to selectively activate multiple lines of the plurality of word lines at the time of reading data; and a bit line selector to select one bit line for each of the plurality of memory banks at the time of writing data, and to select one of the plurality of memory banks at the time of reading data.

DESCRIPTION OF THE EMBODIMENTS

Hereinafter, embodiments of the present invention will be described with reference to the drawings. Note that, the same reference numerals are used to denote the same or equivalent portions throughout the drawings, and the descriptions of the same or equivalent portions will not be repeated.

First Embodiment

Figure 1:
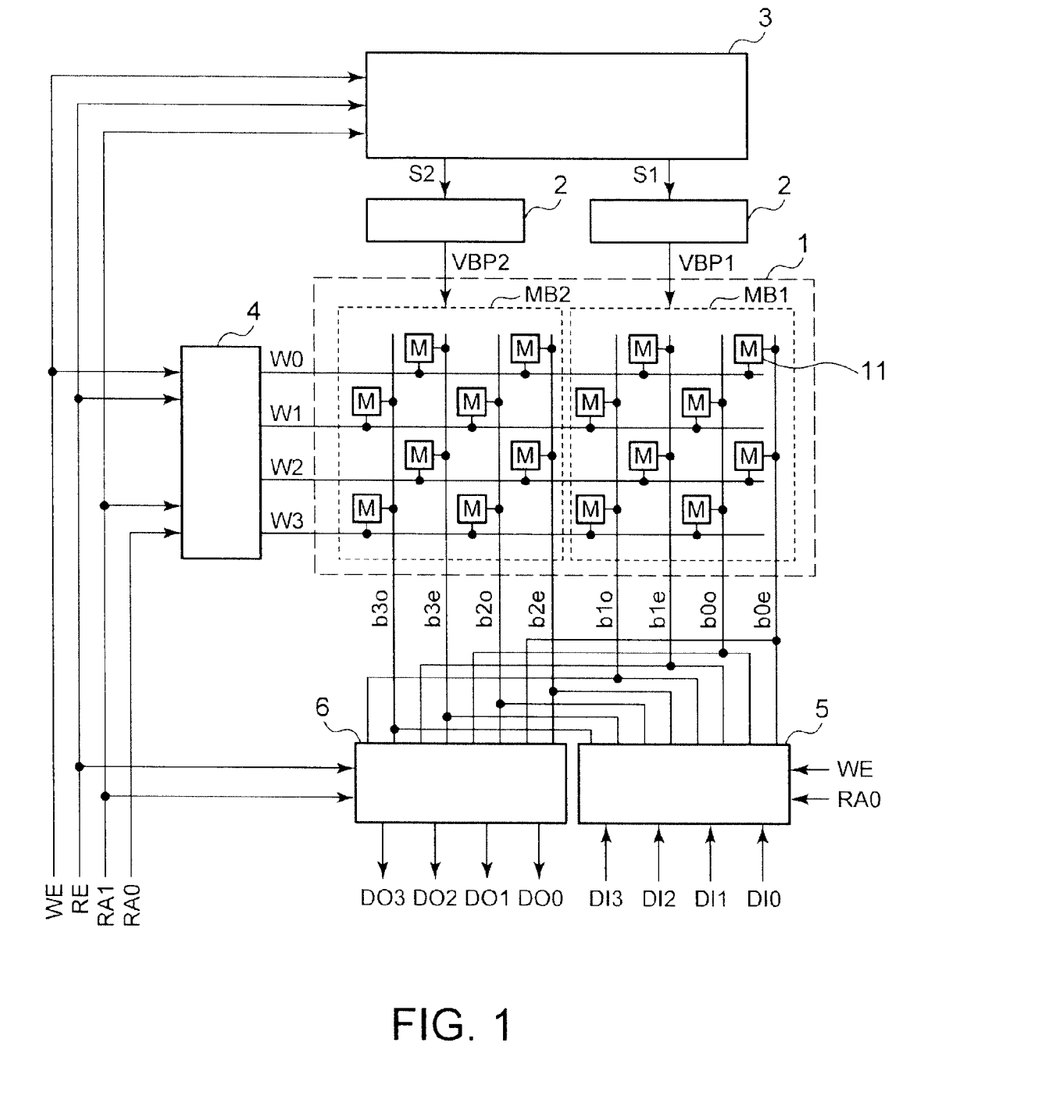
FIG. 1 is a block diagram showing a configuration example of a nonvolatile semiconductor memory device according to a first embodiment of the present invention.

FIG. 1 is a block diagram showing a configuration example of a nonvolatile semiconductor memory device according to a first embodiment of the present invention. In this embodiment, an example of an OTP memory of a four-bit×four-word configuration using an anti-fuse element is shown. Note that, the bit and word configuration of the OTP memory to which the present invention is applied is not limited to this example.

The OTP memory of the present invention includes a memory cell array 1, two booster circuits 2, a booster circuit controller 3, a word line selector 4, a write bit line selector 5 and a read bit line selector 6. In the memory cell array 1, sixteen memory cells 11 each including an anti-fuse element are arranged. The booster circuits 2 are arranged in memory banks MB1, MB2, respectively, the memory banks MB1, MB2 obtained by dividing the memory cell array 1 into two pieces. Each of the booster circuits 2 generates a write and read voltage VBP to be supplied to the anti-fuse element of each of the memory cells included in the respective memory banks. The booster circuit controller 3 issues an instruction to generate a write voltage and read voltage to the two booster circuits 2. The word line selector 4 activates a different word line at the time of writing from one to be activated at the time of reading, with respect to the same address value of an address signal. The write bit line selector 5 selects bit lines to perform writing simultaneously from all of the bit lines at the time of writing. The read bit line selector 6 selects a bit line to output data at the time of reading.

Two bit lines are provided to each one bit of input data DI0 to DI3 in the memory cell array 1. Specifically, bit lines b0*e*, b0*o* are provided to the input DI0, bit lines b1*e*, b1*o* are provided to the input DI1, bit lines b2*e*, b2*o* are provided to the input DI2, and bit lines b3*e*, bio are provided to the input DI3. In addition, as the word lines of the memory cell array 1, four word lines W0, W1, W2, W3 outputted from the word line selector 4 are provided.

Here, when the word lines W0, W2 are termed as even address word lines, and the word lines W1, W3 are termed as odd address word lines, the memory cells 11 are arranged at intersection points between the bit lines b0e, b1e, b2e, b3e and the even address word lines, and intersection points between the bit lines b0o, b1o, b2o, bio and the odd address word lines in the memory cell array 1.

Figure 2:
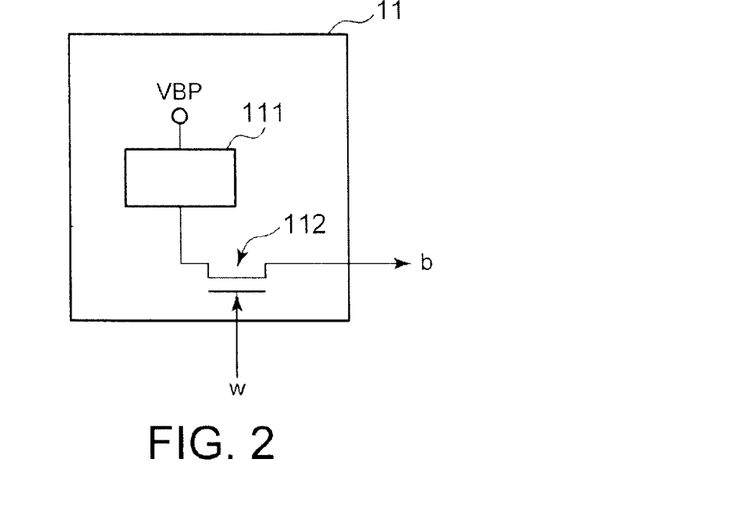
FIG. 2 is a block diagram showing a configuration example of a memory cell of the first embodiment of the present invention.

FIG. 2 shows an example of an internal configuration of the memory cell 11.

The memory cell 11 has an anti-fuse element 111 and a selection transistor 112. The output voltage VBP of the booster circuit 2 is applied to one end of the anti-fuse element 111. The selection transistor 112 connects the other end of the anti-fuse element 111 to a bit line b when a word line W is activated.

In this embodiment, the memory banks MB1 and MB2 are formed by dividing the memory cell array 1 into two pieces in the wiring direction of the word lines, the memory cell array 1 including the memory cells 11 arranged at the aforementioned intersection points, respectively.

Specifically, the memory bank MB1 includes the memory cells 11 connected to the bit lines b0e, b0o, b1e, b1o, and the memory bank MB2 includes the memory cells 11 connected to the bit lines b2e, b2o, b3e, bio.

In this embodiment, the booster circuits 2 are provided to the memory banks MB1, MB2, respectively. As the write voltage or read voltage to be applied to the anti-fuse elements, a VBP1 is applied to the memory bank MB1, and a VBP2 is applied to the memory bank MB2.

The word line selector 4 receives a write signal WE, a read signal RE and address signals RA0, RA1 as the input signals and then selects a word line to be activated in accordance with a combination of the signals.

Figure 3A:
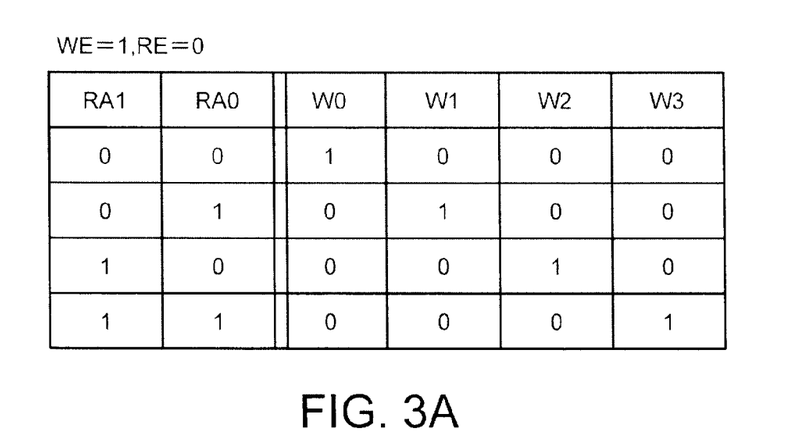
FIGS. 3A and 3B are truth-value tables to show a relationship between input signals and word line selection of a word line selector according to the first embodiment of the present invention.
Figure 3B:
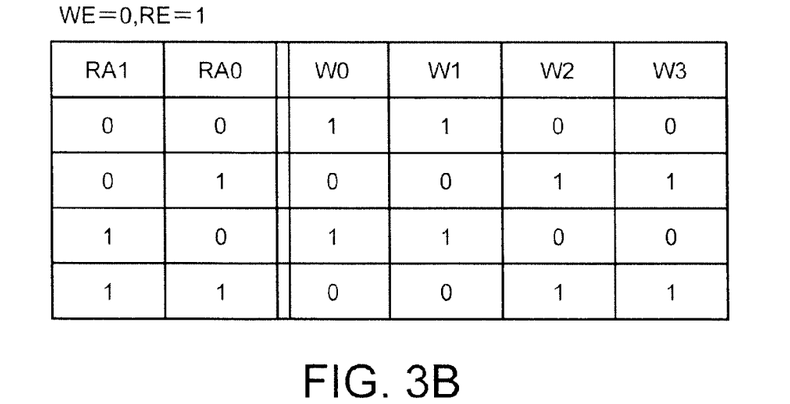

FIGS. 3A and 3B are truth-value tables to show a relationship between the input signals of the word line selector 4 and selection of the word lines W0 to W3. Here, the activated word line is shown as "1."

FIG. 3A is a truth-value table showing an example of the selection of the word lines W0 to W3 at the time of writing (write signal WE=1, read signal RE=0).

In this example, the word lines W0, W1, W2 and W3 are activated when the address signals RA0, R1 are (0, 0), (0, 1), (1, 0) and (1, 1), respectively.

Meanwhile, FIG. 3B is a truth-value table showing an example of the selection of the word lines W0 to W3 at the time of reading (write signal WE=0, read signal RE=1).

In this example, the word lines W0 and W1 are activated when the address signals RA0, P1 are (0, 0), the word lines W2 and W3 are activated when the address signals RA0, R1 are (0, 1). Moreover, the word lines W0 and W1 are activated when the address signals RA0, R1 are (1, 0), and the word lines W2 and W3 are activated when the address signals RA0, R1 are (1, 1).

As described above, the word line selector 4 activates one word line for the write address at the time of writing. The word line selector 4 activates a pair of an even address word line and an odd address word line simultaneously for the read address at the time of reading.

The write bit line selector 5 first makes a choice to set bit lines to output values of the input data DI0 to DI3 to be the bit lines b0e, b1e, b2e, b3e or the bit lines b0o, b1o, b2o, b3o in accordance with the value of the address signal line RA0 at the time of writing (write signal WE=1). Subsequently, bit lines to output the input data simultaneously are sequentially selected one by one from the memory banks MB1 and MB2, respectively.

Figure 4:
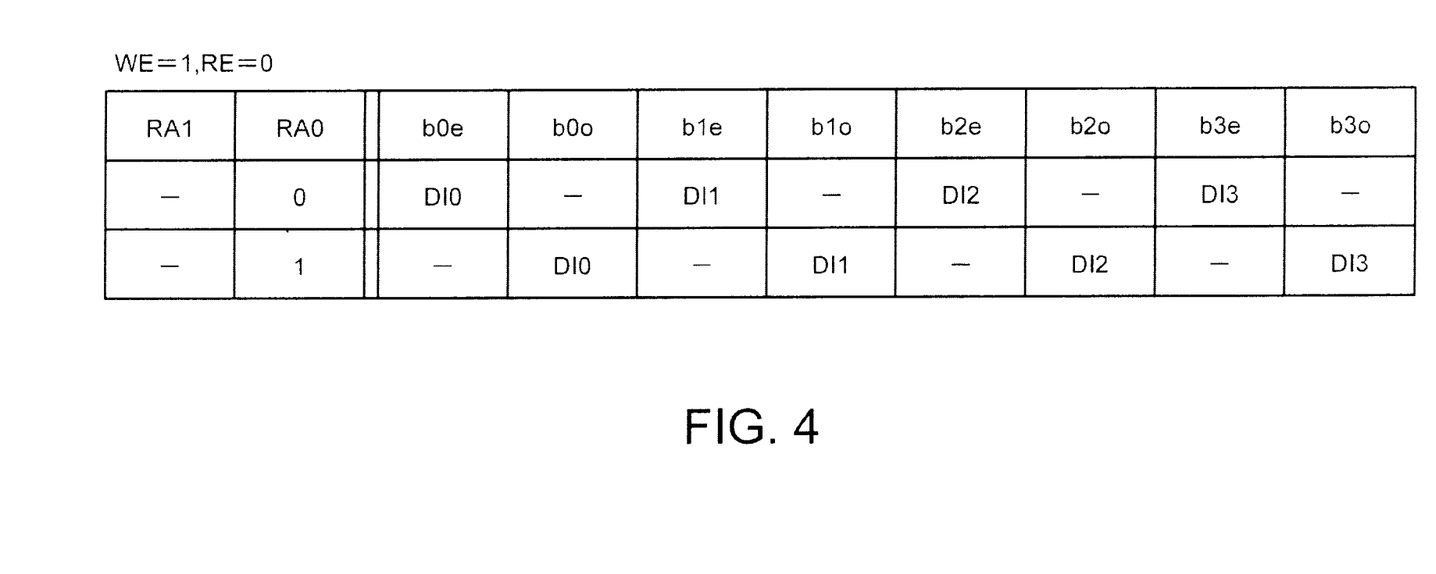
FIG. 4 is a truth-value table showing a relationship between input signals and bit line selection of a write bit line selector according to the first embodiment of the present invention.

FIG. 4 shows a truth-value table showing a relationship between the input signals of the write bit line selector 5 and bit line selection.

In this example, as the bit lines to output the values of the input data DI0 to DI3, the bit lines b0e, b1e, b2e, b3e are selected when the address signal RA0=0, and the bit lines b0o, b1o, b2o, b3o are selected when the address signal RA0=1.

Next, when the bit lines b0e, b1e, b2e, b3e are selected, the bit lines b0e and b2e are selected first, and after writing of the data ends, the bit lines b1e and b3e are selected. Likewise, when the bit lines b0o, b1o, b2o, b3o are selected, the bit lines b0o and b2o are selected first, and after writing of the data ends, the bit lines b1o and b3o are selected.

The read bit line selector 6 makes a choice to set bit lines for producing outputs as output data DO0 to DO3 to be the bit lines b0e, b0o, b1e, b1o of the memory bank MB1, or to be the bit lines b2e, b2o, b3e, b3o of the memory bank MB2 in accordance with the value of the address signal line RA1 at the time of reading (read signal RE=1).

Figure 5:
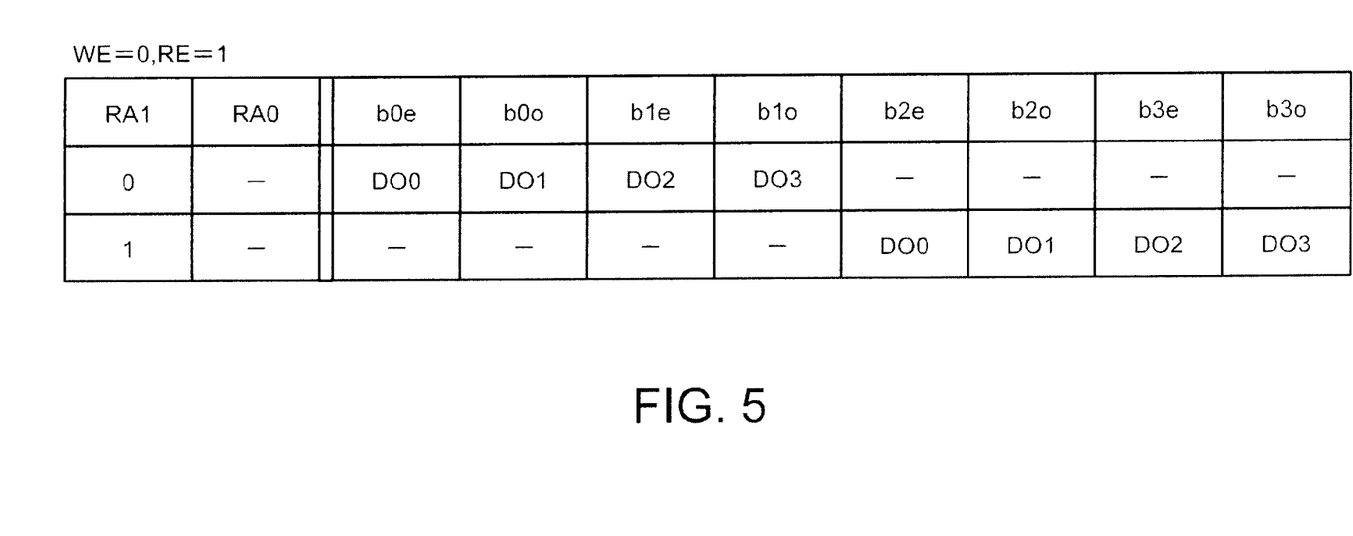
FIG. 5 is a truth-value table showing a relationship between output signals and bit line selection of a read bit line selector according to the first embodiment of the present invention.

FIG. 5 is a truth-value table showing a relationship between the output signals of the read bit line selector 6 and bit line selection.

In this example, as the bit lines for producing outputs as the output data DO0 to DO3, the bit lines b0e, b0o, b1e, b1o of the memory bank MB1 are selected when the address signal RA1=0, and the bit lines b2e, b2o, b3e, b3o of the memory bank MB2 are selected when the address signal RA1=1.

At the time of reading, the booster circuit controller 3 issues, in accordance with the selection of the read bit line selector 6, an instruction to generate a read voltage to the booster circuit 2 of the memory bank including the selected bit lines. On the other hand, at the time of writing, the booster circuit controller 3 issues an instruction to generate a write voltage to both of the booster circuits 2.

For this reason, the write signal WE, the read signal RE and the address signal RA1 are inputted to the booster circuit controller 3. Then, in accordance with the combination of the signals, the outputs of an instruction signal S1 to the booster circuit 2 of the memory bank MB1 and an instruction signal S2 to the booster circuit 2 of the memory bank MB2 are determined.

Figure 6:
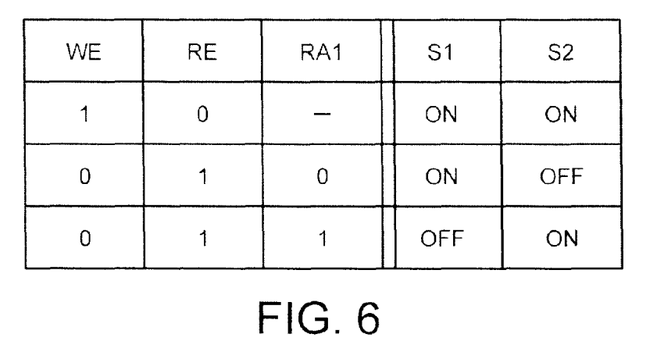
FIG. 6 is a truth-value table showing a relationship between input signals and output signals of a booster circuit controller according to the first embodiment of the present invention.

FIG. 6 shows a relationship between the input signals and the outputs of the instruction signals of the booster circuit controller 3 in a truth-value table. Here, the instruction to generate an output voltage is indicated by "ON," and the instruction not to generate an output voltage is indicated by "OFF."

The booster circuit controller 3 sets both of the instruction signals S1, S2 to "ON" when the write signal WE=1. Meanwhile, when the read signal RE=1 and the address signal RA1=0, the booster circuit controller 3 sets the instruction signal S1 to "ON" and the instruction signal S2 to "OFF." When the read signal RE=1 and the address signal RA1=1, the booster circuit controller 3 sets the instruction signal S1 to "OFF" and the instruction signal S2 to "ON."

Next, an example of a write operation in the first embodiment will be described with reference to FIGS. 7 to 10.

Figure 7:
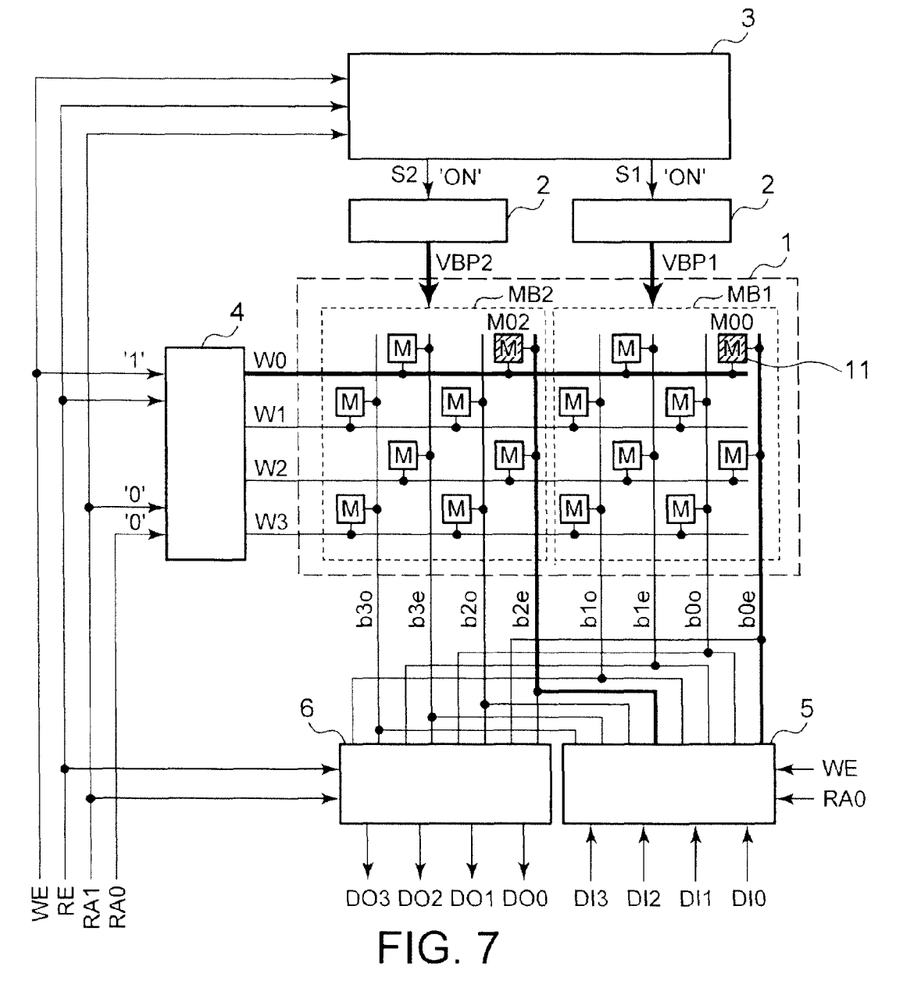
FIG. 7 is an explanatory diagram of a write operation of the nonvolatile semiconductor memory device according to the first embodiment.
Figure 8:
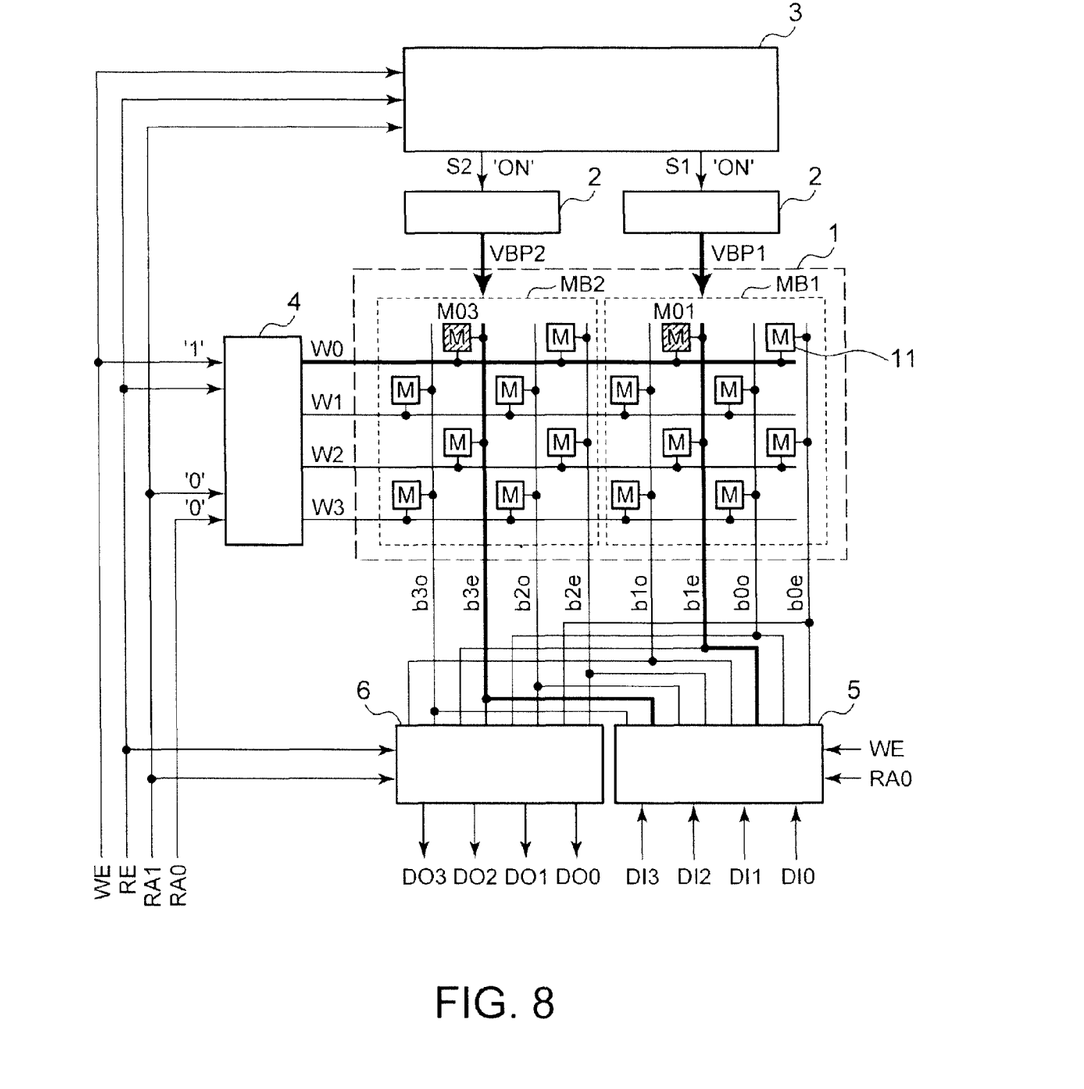
FIG. 8 is another explanatory diagram of the write operation of the nonvolatile semiconductor memory device according to the first embodiment.

FIGS. 7 and 8 are diagrams to show an example of the write operation when the address signal RA0=0 and the address signal RA1=0. In this case, since the write signal WE=1, the word line W0 is activated by the word line selector 4. In addition, the instruction signals S1, S2 outputted from the booster circuit controller 3 are both set to "ON," and the write voltages VBP1 and VBP2 are supplied to the memory banks MB1 and MB2 by the booster circuits 2, respectively.

FIG. 7 shows a state where the bit lines b0e and b2e are selected by the write bit line selector 5. In this case, data is written to the memory cell 11 (the memory cell is referred to as an "M00," and hereinafter, the others will be referred in the same manner) at the intersection point between the word line W0 and the bit line b0e in the memory bank MB1. Moreover, data is written to the memory cell 11 (M02) at the intersection point between the word line W0 and the bit line b2e in the memory bank MB2.

FIG. 8 shows a state where the bit lines b1e and b3e are selected by the write bit line selector 5, thereafter. In this case, data is written to the memory cell 11 (M01) at the intersection point between the word line W0 and the bit line b1e in the memory bank MB1. Moreover, data is written to the memory cell 11 (M03) at the intersection point between the word line W0 and the bit line b3e in the memory bank MB2.

Figure 9:
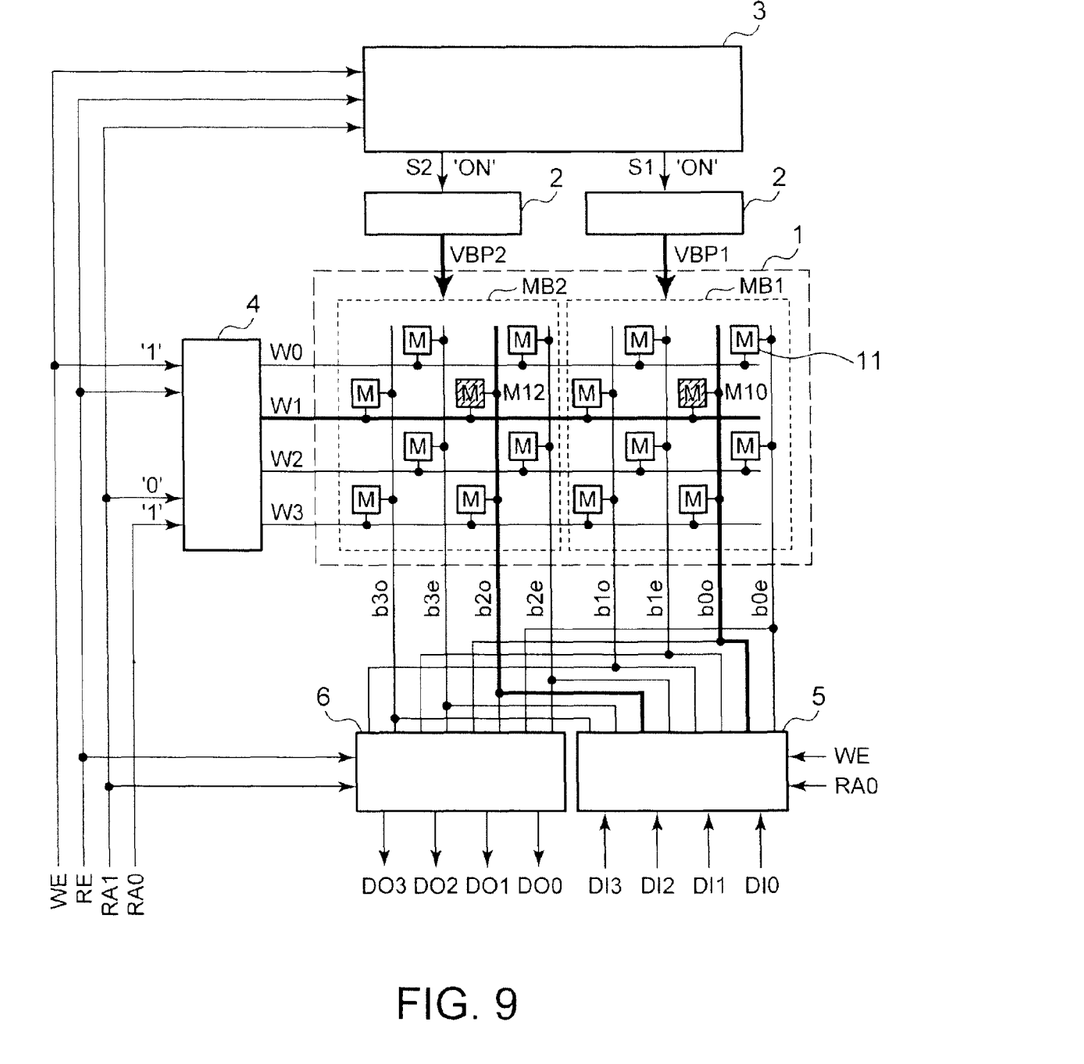
FIG. 9 is an explanatory diagram of a write operation of the nonvolatile semiconductor memory device according to the first embodiment.
Figure 10:
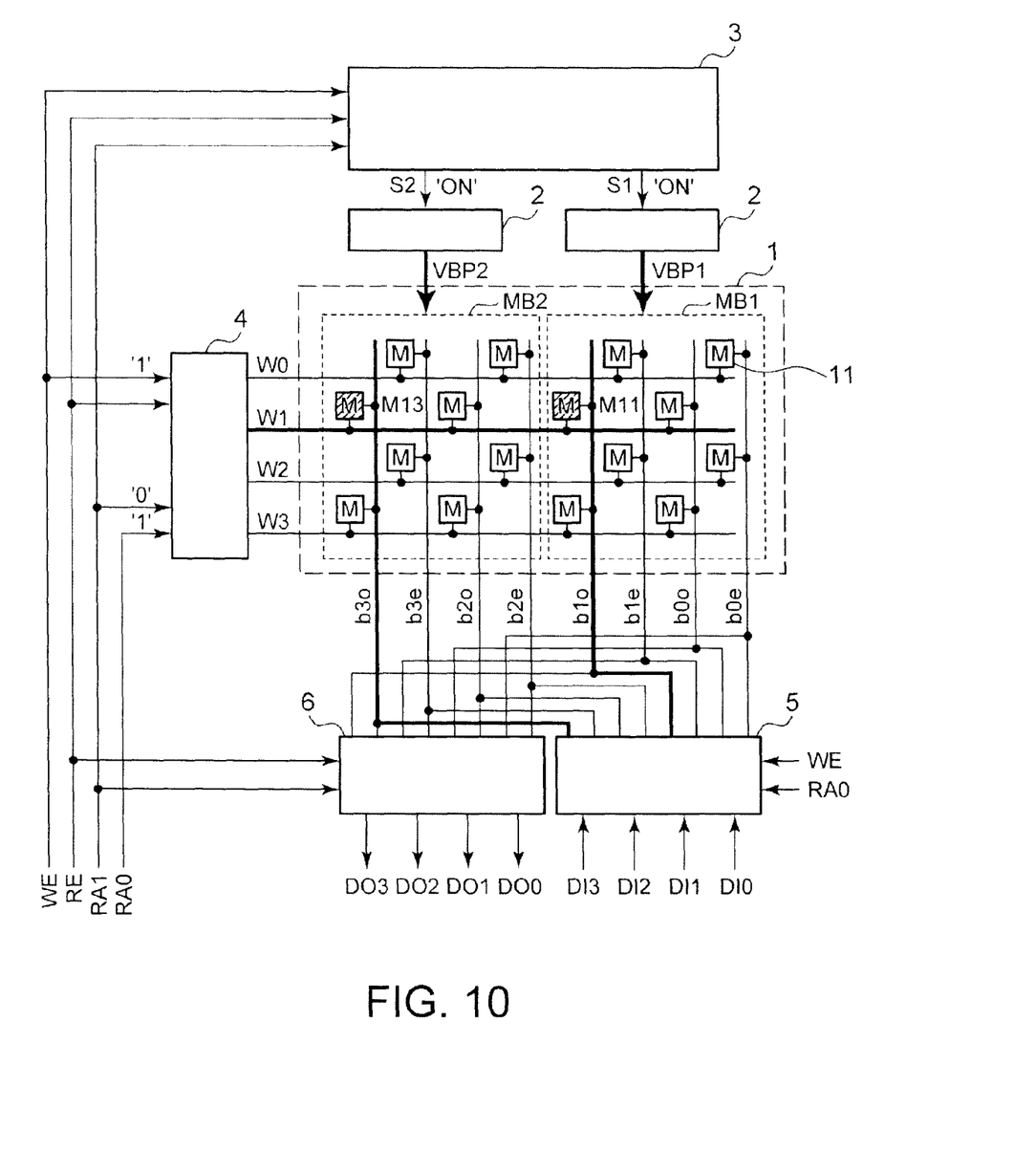
FIG. 10 is another explanatory diagram of the write operation of the nonvolatile semiconductor memory device according to the first embodiment.

Meanwhile, FIGS. 9 and 10 are diagrams to show an example of the write operation when the address signal RA0=1 and the address signal RA1=0. In this case, the word line W1 is activated by the word line selector 4. In addition, the write voltages VBP1 and VBP2 are supplied to the memory banks MB1 and MB2, respectively.

FIG. 9 shows a state where the bit lines b0o and b2o are selected by the write bit line selector 5. In this case, data is written to the memory cell 11 (M10) at the intersection point between the word line W1 and the bit line b0o in the memory bank MB1. Moreover, data is written to the memory cell 11 (M12) at the intersection point between the word line W1 and the bit line b2o in the memory bank MB2.

FIG. 10 shows a state where the bit lines b1o and b3o are selected by the write bit line selector 5, thereafter. In this case, data is written to the memory cell 11 (M11) at the intersection point between the word line W1 and the bit line b1o in the memory bank MB1. Moreover, data is written to the memory cell 11 (M13) at the intersection point between the word line W1 and the bit line b3o in the memory bank MB2.

As described above, in this embodiment, writing of the input data DI0 to DI3 to the memory cells 11 selected by each of the word lines is performed twice for two bits each.

Next, an example of a read operation in the first embodiment will be described with reference to FIGS. 11 to 12.

Figure 11:
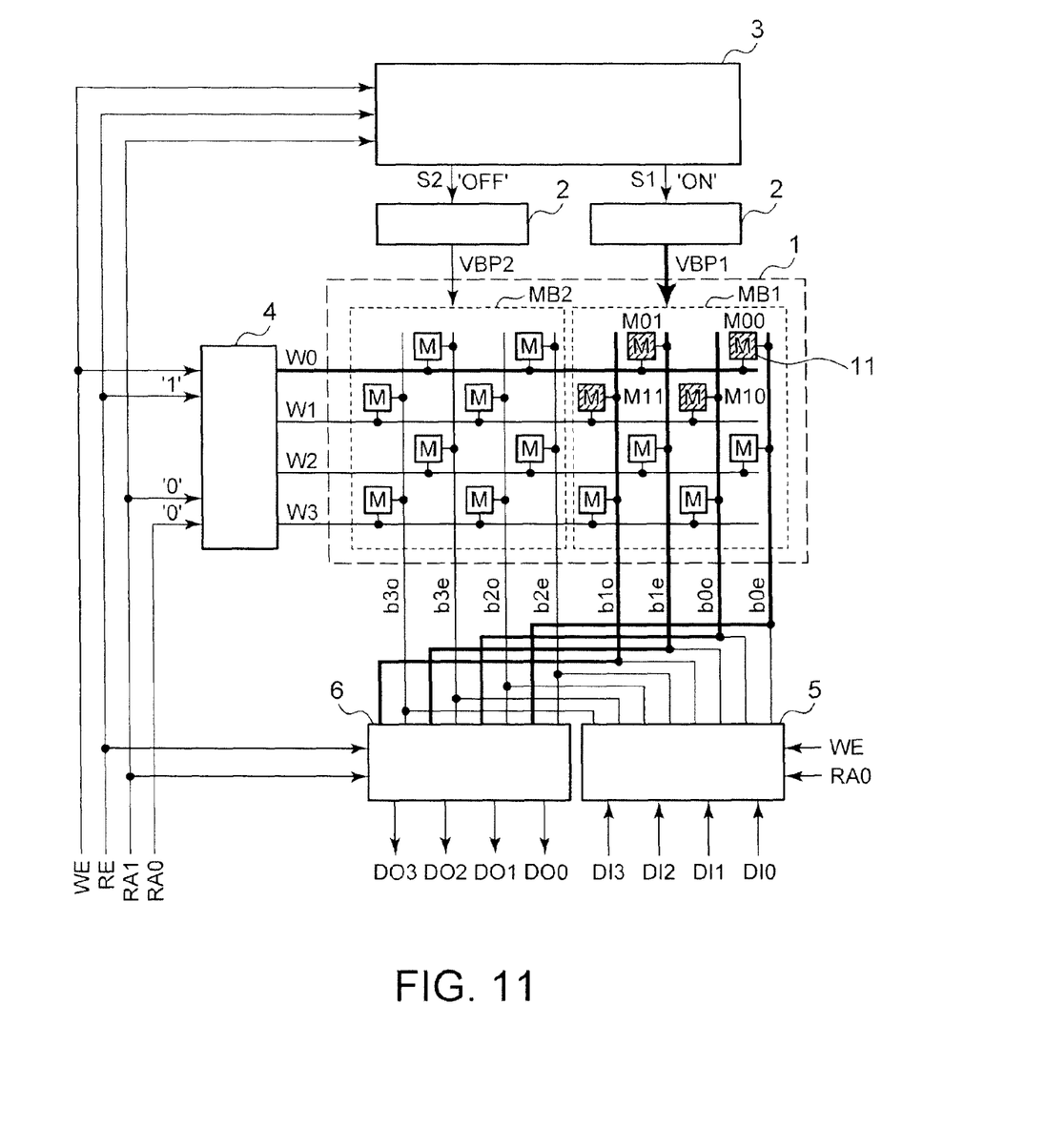
FIG. 11 is an explanatory diagram of a read operation of the nonvolatile semiconductor memory device according to the first embodiment.

FIG. 11 is a diagram showing an example of the read operation when the address signal RA0=0 and the address signal RA1=0. In this case, since the read signal RE=1, the word lines W0 and W1 are activated by the word line selector 4. In addition, since the address signal RA1=0, the instruction signals S1 and S2 to be outputted from the booster circuit controller 3 are set to "ON" and "OFF," respectively. Thereby, the read voltage VBP1 is supplied to the memory bank MB1 by the corresponding booster circuit 2, but no read voltage is supplied to the memory bank MB2.

At this time, the read bit line selector 6 selects the bit lines b0e, b0o, b1e, b1o of the memory bank MB1 and then outputs data retained in the memory cells 11 (M00), (M10), (M01), (M11) as the output data DO0 to DO3, respectively.

Figure 12:
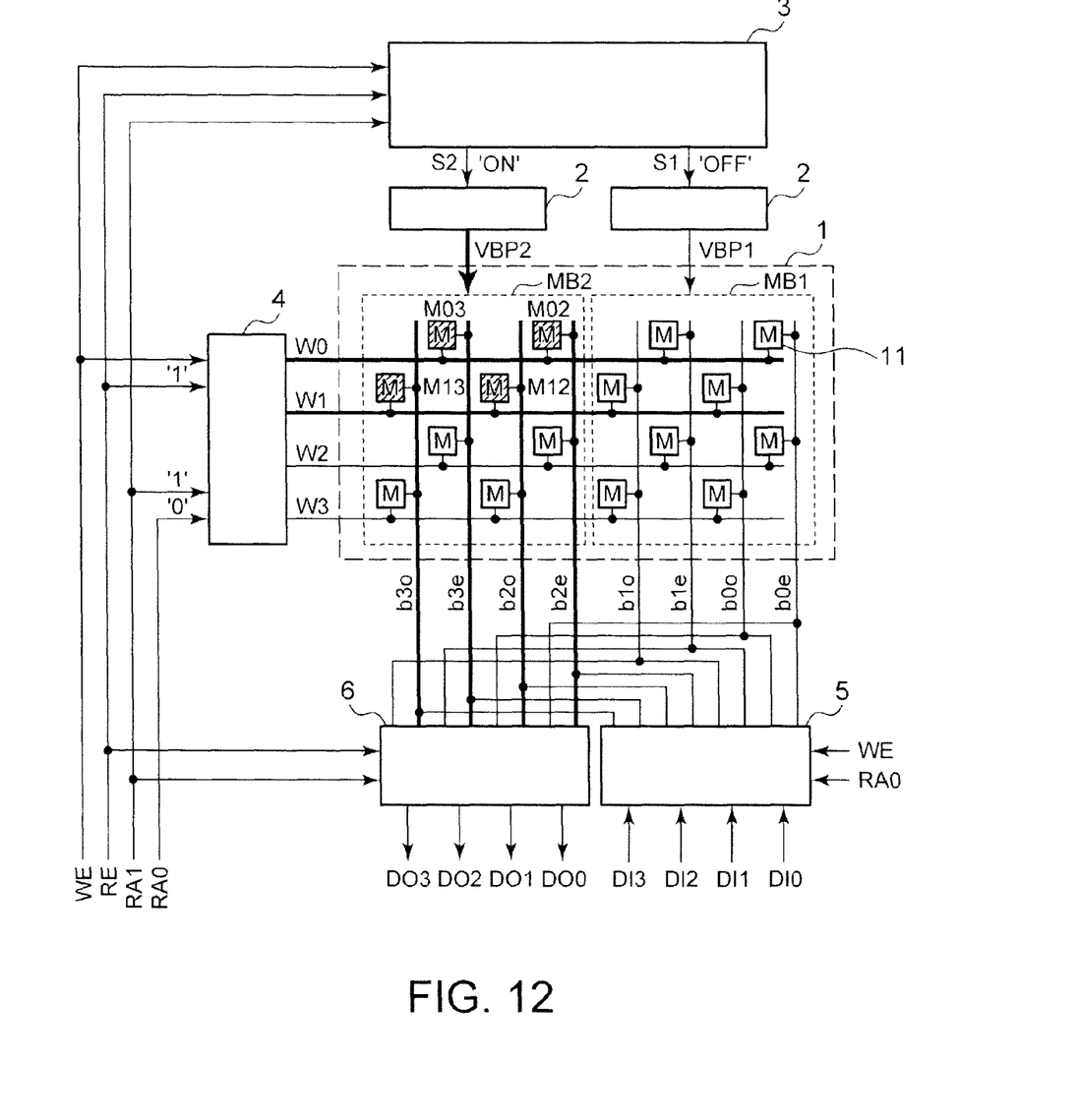
FIG. 12 is an explanatory diagram of a read operation of the nonvolatile semiconductor memory device according to the first embodiment.

Meanwhile, FIG. 12 is a diagram showing an example of the read operation when the address signal RA0=0 and the address signal RA1=1. In this case, the word lines W0 and W1 are activated by the word line selector 4. In addition, since the address signal RA1=1, the instruction signals S1 and S2 to be outputted from the booster circuit controller 3 are set to "OFF" and "ON," respectively. Thereby, the read voltage VBP2 is supplied to the memory bank MB2 by the corresponding booster circuit 2, but no read voltage is supplied to the memory bank MB1.

At this time, the read bit line selector 6 selects the bit lines b2e, b2o, b3e, b3o of the memory bank MB2 and then outputs data retained in the memory cells 11 (M02), (M12), (M03), (M13) as the output data DO0 to DO3, respectively.

According to the first embodiment described above, the memory cell array 1 is divided into the two memory banks MB1 and MB2. Then, at the time of writing, the writing is performed by selecting only one memory cell 11 from each of the memory banks, so that the output current of each of the booster circuits 2, which supplies a write voltage to a corresponding one of the memory banks, can be small. Thereby, the write voltage to each of the memory banks becomes stable, and the writing of two bits can be performed simultaneously in a stable manner.

Meanwhile, at the time of reading, the read operation is performed for only one of the memory banks. Thus, among the two booster circuits 2, only one booster circuit is operated. Accordingly, as compared with a case where both of the two booster circuits 2 are operated, the amount of current consumed by the OTP memory at the time of reading can be reduced.

Second Embodiment

In a second embodiment, an example of a case where the memory cell array is divided into four memory banks although an example of the case where the memory cell array is divided into the two memory banks is shown in the first embodiment.

Figure 13:
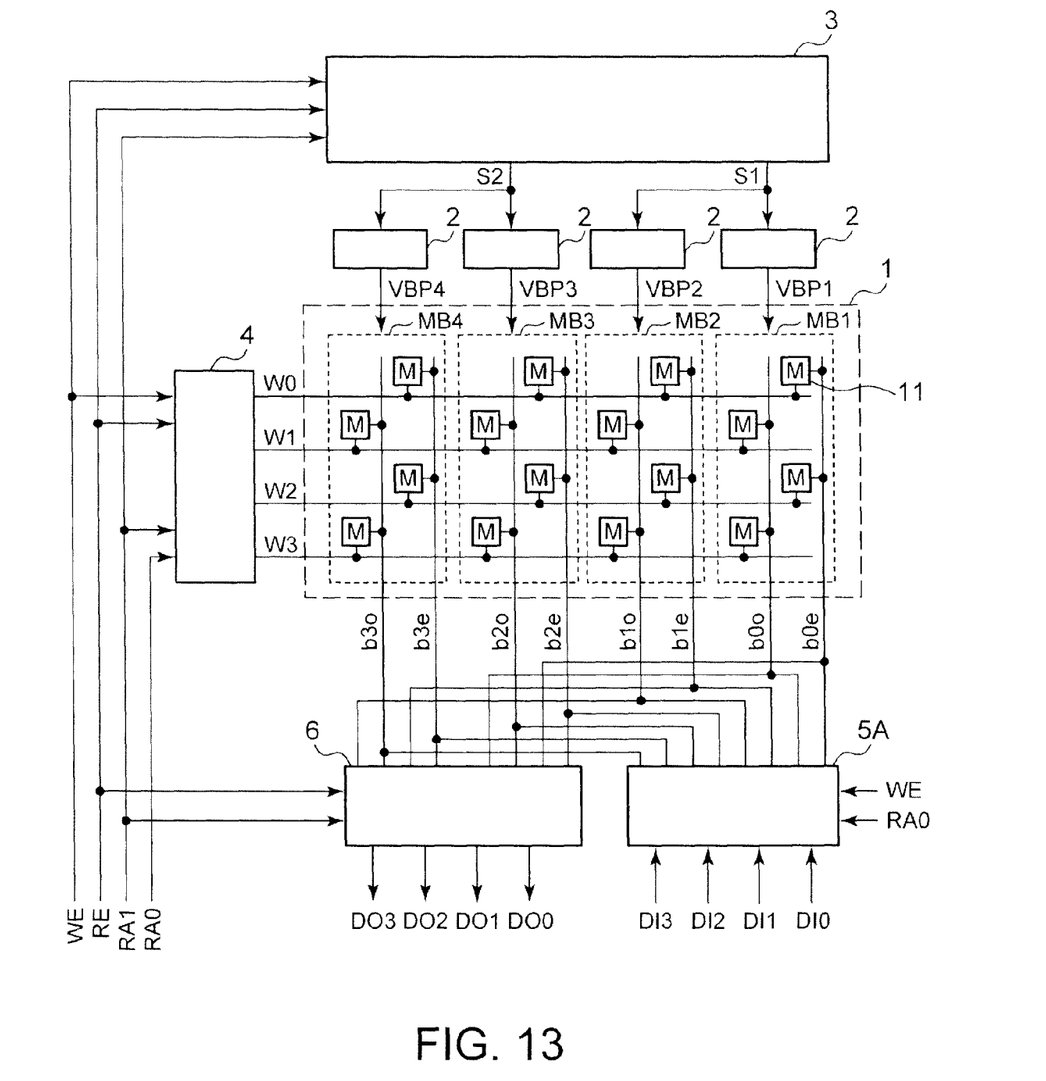
FIG. 13 is a block diagram showing a configuration example of a nonvolatile semiconductor memory device according to a second embodiment of the present invention.

FIG. 13 is a block diagram showing a configuration example of a nonvolatile semiconductor memory device according to the second embodiment of the present invention.

In the second embodiment, the memory cell array 1 of the same OTP memory of a four-bit×four-word configuration as that of the first embodiment is divided into four memory banks, MB1, MB2, MB3, MB4.

The booster circuits 2 are provided to the four memory banks MB1 to MB4, respectively. Among the booster circuits 2, the booster circuits 2 provided to the memory banks MB1, MB2, respectively, are controlled by the instruction signal S1 outputted from the booster circuit controller 3 for generation of the output voltages VBP1, VBP2 of each of the booster circuits 2. In addition, the booster circuits 2 for the memory banks MB3, MB4 are controlled by the instruction signal S2 outputted from the booster circuit controller 3 for generation of the output voltages VBP3, VBP4 of each of the booster circuits 2.

A write bit line selector 5A of the second embodiment selects one bit line from each of the memory banks, that is, a total of four bit lines simultaneously at the time of writing since there are four memory banks.

Specifically, the write bit line selector 5A selects the bit lines b0e, b1e, b2e, b3e, when the address signal RA0=0, and selects the bit lines b0o, b1o, b2o, b3o, when the address signal RA0=1.

In the second embodiment as well, in accordance with the value of the address signal RA1, the read bit line selector 6 selects bit lines, in the units of the memory banks, for producing outputs as the output data DO0 to DO3, at the time of reading. Then, the read bit line selector 6 selects whether to set the four lines of the bit lines b0e, b0o of the memory bank MB1 and the bit lines of b1e, b1o of the memory bank MB2, or to set the four lines of the bit lines b2e, b2o of the memory bank MB3 and the bit lines of b3e, b3o of the memory bank MB4.

Specifically, when the address signal RA1=0, the bit lines b0e, b0o, b1e, b1o are selected, and when the address signal RA1=1, the bit lines b2e, b2o, b3e, b3o are selected.

Next, an example of a write operation in the second embodiment will be described with reference to FIG. 14.

Figure 14:
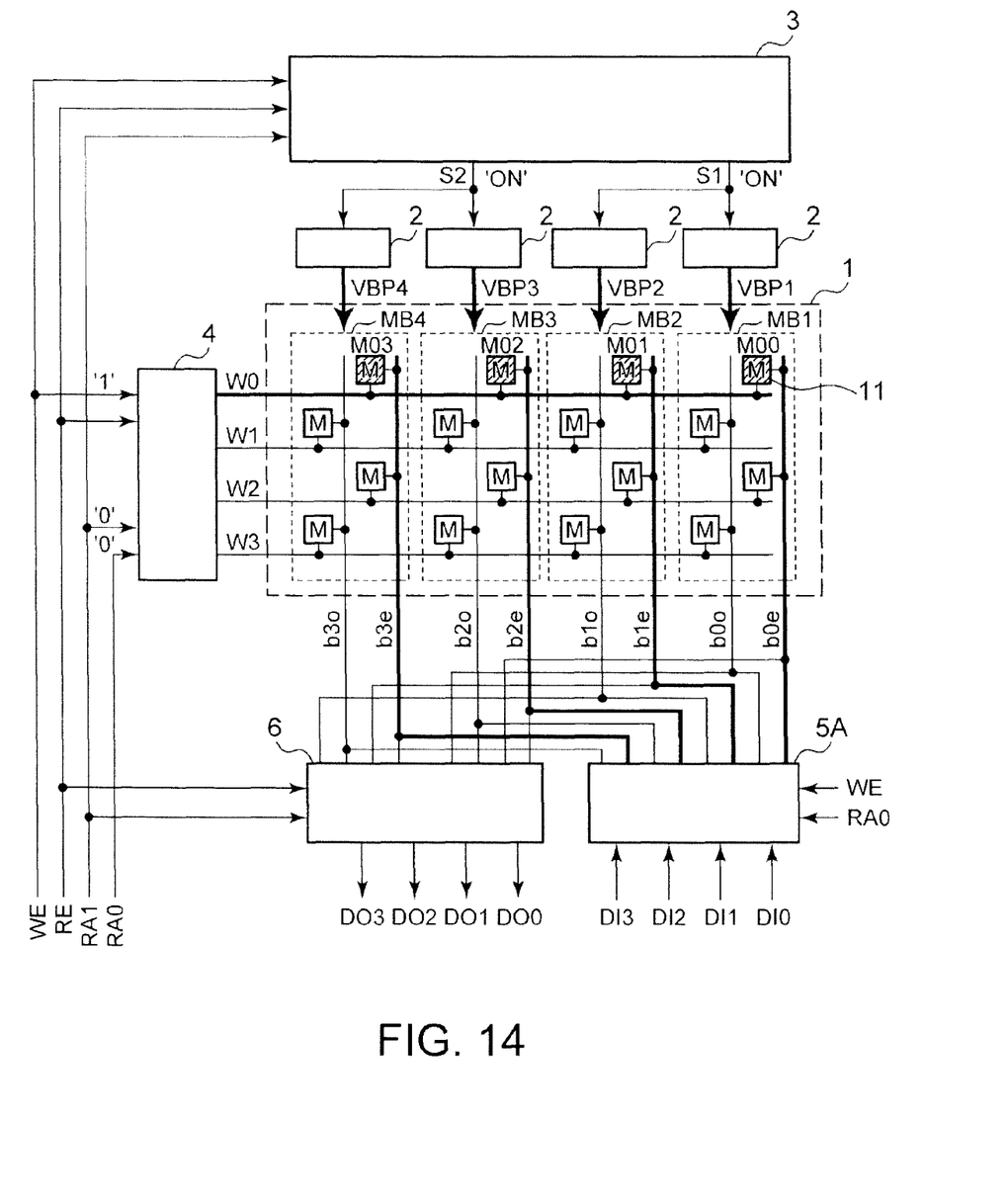
FIG. 14 is an explanatory diagram of a write operation of the nonvolatile semiconductor memory device according to the second embodiment.

FIG. 14 is a diagram showing an example of the write operation when the address signal RA0=0, and the address signal RA1=0. In this case, as in the case of the first embodiment, the word line W0 is activated by the word line selector 4. In addition, since both of the instruction signals S1, S2 outputted from the booster circuit controller 3 are "ON," write voltages VBP1, VBP2, VBP3, and VBP 4 are supplied to the memory banks MB1, MB2, MB3 and MB4, respectively.

At this time, the bit lines b0e, b1e, b2e, b3e are selected by the write bit line selector 5A, data is written to the memory cell 11 (M00) of the memory bank MB1, the memory cell 11 (M01) of the memory bank MB2, the memory cell 11 (M02) of the memory bank MB3 and the memory cell 11 (M03) of the memory bank MB4.

Specifically, in this embodiment, four bits of the input data DI0 to DI3 are simultaneously written to the memory cells 11 selected by each of the word lines.

Next, an example of a read operation in the second embodiment will be described with reference to FIG. 15.

Figure 15:
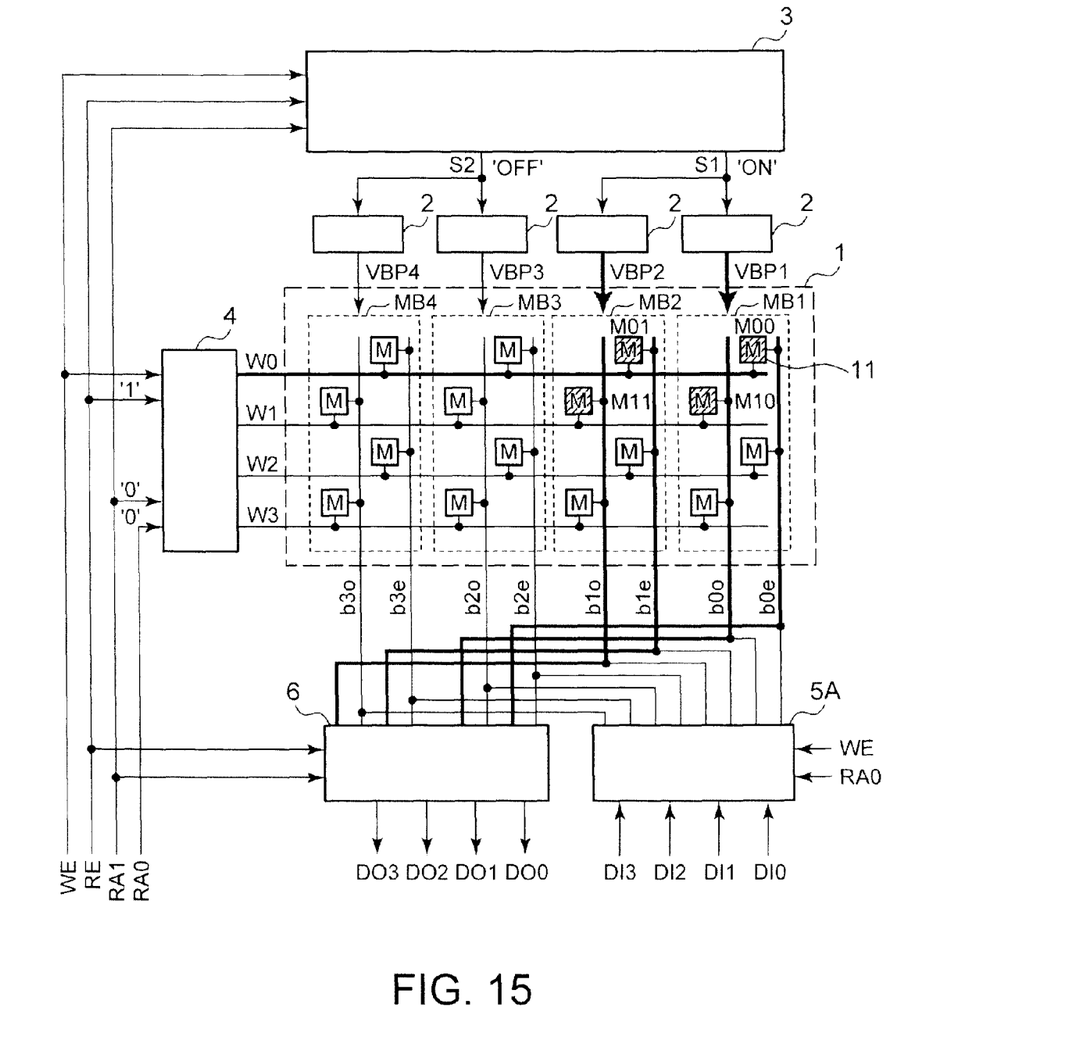
FIG. 15 is an explanatory diagram of a read operation of the nonvolatile semiconductor memory device according to the second embodiment.

FIG. 15 is a diagram showing an example of the read operation when the address signal RA0=0 and the address signal RA1=0. In this case, as in the case of the first embodiment, the word lines W0 and W1 are activated by the word line selector 4. In addition, since the instruction signals S1 and S2 are set to "ON" and "OFF," respectively, the read voltages VBP1, VBP2 are supplied to the memory banks MB1, MB2, respectively, but no read voltage is supplied to the memory banks MB3, MB4.

At this time, the read bit line selector 6 selects the bit lines b0e, b0o of the memory bank MB1 and the bit lines b1e, b1o of the memory bank MB2, and then outputs data retained in the memory cells 11 (M00), (M10), (M01), (M11) as the output data DO0 to DO3, respectively.

According to the second embodiment described above, the memory cell array 1 is divided into the four memory banks MB1 to MB4. Then, at the time of writing, the write operation is performed while only one memory cell 11 is selected from each of the memory banks, so that the write operation of four bits can be performed simultaneously. When the number of bits that can be written simultaneously is increased, the time required for the write operation of the bits can be reduced by the amount equivalent to the increased number of bits.

In addition, at the time of reading, data is read from only two memory banks among the four memory banks, so that the read operation can be performed by operating only the two booster circuits 2 among the four booster circuits. Thereby, as compared with the case where the four booster circuits 2 are operated, the amount of current consumed by the OTP memory at the time of reading can be reduced.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A nonvolatile semiconductor memory device comprising:
    a memory cell array in which two bit lines are provided to each one bit of input data, and memory cells each including an anti-fuse element are arranged at an intersection point between one of the two bit lines and an even address word line, and an intersection point between the other one of the two bit lines and an odd address word line, respectively;
    a plurality of booster circuits which are arranged in a plurality of memory banks, respectively, and each of which generates a write voltage and a read voltage to be supplied to a corresponding one of the anti-fuse elements of the respective memory banks, each of the memory banks obtained by dividing the memory cell array;
    a booster circuit controller to issue an instruction to generate the write voltage and the read voltage to the plurality of booster circuits;
    a word line selector to activate a different word line at the time of writing from one to be activated at the time of reading, with respect to the same address value of an address signal;
    a write bit line selector to select bit lines one by one from the memory banks, respectively, at the time of writing, the bit lines performing writing simultaneously; and
    a read bit line selector to select a bit line at the time of reading, the bit line outputting data.

2. The nonvolatile semiconductor memory device according to claim 1, wherein
    the word line selector activates one word line for a write address at the time of writing, and
    the word line selector activates a pair of an even address word line and an odd address line simultaneously for a read address at the time of reading.

3. The nonvolatile semiconductor memory device according to claim 2, wherein
    the write bit line selector selects any one of the two bit lines of each bit of the input data.

4. The nonvolatile semiconductor memory device according to claim 3, wherein
    the read bit line selector selects a bit line, in a memory bank unit, from the bit lines of the memory cells connected to the word lines activated by the word line selector at the time of reading.

5. The nonvolatile semiconductor memory device according to claim 4, wherein
    the booster circuit controller issues, at the time of writing, an instruction to output the write voltage to all of the booster circuits, and
    the booster circuit controller issues, at the time of reading, an instruction to output the read voltage to only the booster circuit arranged in the memory bank to which the bit line selected by the read bit line selector belongs.

6. The nonvolatile semiconductor memory device according to claim 1, wherein
    the anti-fuse element includes an insulating film that is broken down to reduce a resistance value of the anti-fuse element when the write voltage is applied to the anti-fuse element.

7. The nonvolatile semiconductor memory device according to claim 6, wherein
    the anti-fuse element stores data depending on whether or not a current flows through the anti-fuse element when the read voltage is applied to the anti-fuse element.

8. The nonvolatile semiconductor memory device according to claim 1, wherein the write voltage is greater than the read voltage.

9. A nonvolatile semiconductor memory device comprising:
    a first memory bank including a plurality of first bit lines, a plurality of word lines intersecting with the plurality of first bit lines, and a plurality of memory cells provided at intersection points between the plurality of first bit lines and the plurality of word lines, each of the plurality of memory cells including an anti-fuse element;

a second memory bank including a plurality of second bit lines, the plurality of word lines intersecting with the plurality of second bit lines, and a plurality of memory cells provided at intersection points between the plurality of second bit lines and the plurality of word lines, each of the plurality of memory cells including an anti-fuse element;

a first booster circuit to supply a write voltage and a read voltage to the plurality of first bit lines;

a second booster circuit to supply a write voltage and a read voltage to the plurality of second bit lines;

a booster circuit controller to control operations of the first and second booster circuits;

a word line selector to activate one of the plurality of word lines at the time of writing data, and to activate a plurality of lines of the plurality of word lines at the time of reading data;

a write bit line selector to select one of the plurality of first bit lines and one of the plurality of second bit lines at the time of writing data; and a read bit line selector to select any one set of bit lines from a set of the plurality of first bit lines and a set of the plurality of second bit lines at the time of reading data, wherein the booster circuit controller performs control, at the time of writing data, so that both of the first and second booster circuits output the write voltage, and the booster circuit controller performs control, at the time of reading data, so that one of the first and second booster circuits outputs the read voltage, the one booster circuit corresponding to the one set of bit lines selected by the read bit line selector.

10. The nonvolatile semiconductor memory device according to claim 9, wherein the word line selector activates two word lines adjacent to each other among the plurality of word lines, at the time of reading data.

11. The nonvolatile semiconductor memory device according to claim 9, wherein the first memory bank is divided into a plurality of first sub memory banks each including a part of the plurality of first bit lines, the plurality of word lines, and the plurality of memory cells provided at intersection points between the part of the plurality of first bit lines and the plurality of word lines, each of the plurality of memory cells including the anti-fuse element, the second memory bank is divided into a plurality of second sub memory banks each including a part of the plurality of second bit lines, the plurality of word lines, and the plurality of memory cells provided at intersection points between the part of the plurality of second bit lines and the plurality of word lines, each of the plurality of memory cells including the anti-fuse element, and the write bit line selector selects one of the first bit lines for each of the plurality of first sub memory banks, at the time of writing data, and one of the second bit lines for each of the plurality of second sub memory banks.

12. The nonvolatile semiconductor memory device according to claim 11, wherein a plurality of the first booster circuits are provided corresponding respectively to the plurality of first sub memory banks, and a plurality of the second booster circuits are provided corresponding respectively to the plurality of second sub memory banks.

13. The nonvolatile semiconductor memory device according to claim 9, wherein the anti-fuse element includes an insulating film that is broken down to reduce a resistance value of the anti-fuse element when the write voltage is applied to the anti-fuse element.

14. The nonvolatile semiconductor memory device according to claim 13, wherein the anti-fuse element stores data depending on whether or not a current flows through the anti-fuse element when the read voltage is applied to the anti-fuse element.

15. The nonvolatile semiconductor memory device according to claim 9, wherein the write voltage is greater than the read voltage.

16. A nonvolatile semiconductor memory device comprising:

a plurality of memory banks each including a plurality of memory cells arranged in a matrix, each of the memory cells including an anti-fuse element;

a plurality of booster circuits provided for the plurality of memory banks, respectively, each of the plurality of booster circuits supplying a write voltage and a read voltage to the memory cells included in a corresponding one of the memory banks;

a booster circuit controller to drive all of the plurality of booster circuits so that all of the plurality of booster circuits supply the write voltage to all of the memory banks at the time of writing data, and to select and then drive a part of the plurality of booster circuits so that the part of the plurality of booster circuits supply the read voltage to apart of the memory banks corresponding to the selected part of the booster circuits at the time of reading data;

a word line selector to selectively activate, at the time of writing data, one of a plurality of word lines shared by the plurality of memory banks, and to selectively activate multiple lines of the plurality of word lines at the time of reading data; and a bit line selector to select one bit line for each of the plurality of memory banks at the time of writing data, and to select one of the plurality of memory banks at the time of reading data.

17. The nonvolatile semiconductor memory device according to claim 16, wherein the anti-fuse element includes an insulating film that is broken down to reduce a resistance value of the anti-fuse element when the write voltage is applied to the anti-fuse element.

18. The nonvolatile semiconductor memory device according to claim 17, wherein the anti-fuse element stores data depending on whether or not a current flows through the anti-fuse element when the read voltage is applied to the anti-fuse element.

19. The nonvolatile semiconductor memory device according to claim 16, wherein the write voltage is greater than the read voltage.

* * * * *